United States Patent [19]

Arnold et al.

[11] Patent Number: 4,521,449

[45] Date of Patent: Jun. 4, 1985

[54] PROCESS FOR FORMING A HIGH DENSITY METALLURGY SYSTEM ON A SUBSTRATE AND STRUCTURE THEREOF

[75] Inventors: Anthony F. Arnold; Arnold F. Schmeckenbecher, both of Poughkeepsie, N.Y.

[73] Assignee: International Business Machines Corporation, Armonk, N.Y.

[21] Appl. No.: 612,296

[22] Filed: May 21, 1984

[51] Int. Cl.³ .......................... H05K 3/12; H05K 3/46
[52] U.S. Cl. ........................................ 427/96; 29/851; 29/852; 264/61; 427/97
[58] Field of Search .................... 264/61; 29/851, 852; 427/96

[56] References Cited

U.S. PATENT DOCUMENTS

| | | | |
|---|---|---|---|
| 3,978,248 | 8/1976 | Usami | 427/96 |
| 4,109,377 | 8/1978 | Blazick | 427/96 |
| 4,245,273 | 1/1981 | Feinberg | 361/382 |
| 4,340,618 | 7/1982 | Fury | 427/99 |
| 4,374,457 | 2/1983 | Wiech | 264/63 |
| 4,442,137 | 4/1984 | Kumar | 427/96 |

*Primary Examiner*—John D. Smith
*Attorney, Agent, or Firm*—Wolmar J. Stoffel

[57] ABSTRACT

A process for forming a high density solder pad and fan-out metallurgy system in a ceramic substrate wherein a pattern of indented lines is formed in the surface of a green ceramic substrate, the lines filled with a conductive metal paste, a layer of dielectric green ceramic material deposited over at least a portion of the area of the pattern of indented lines, and sintering the resultant substrate.

15 Claims, 3 Drawing Figures

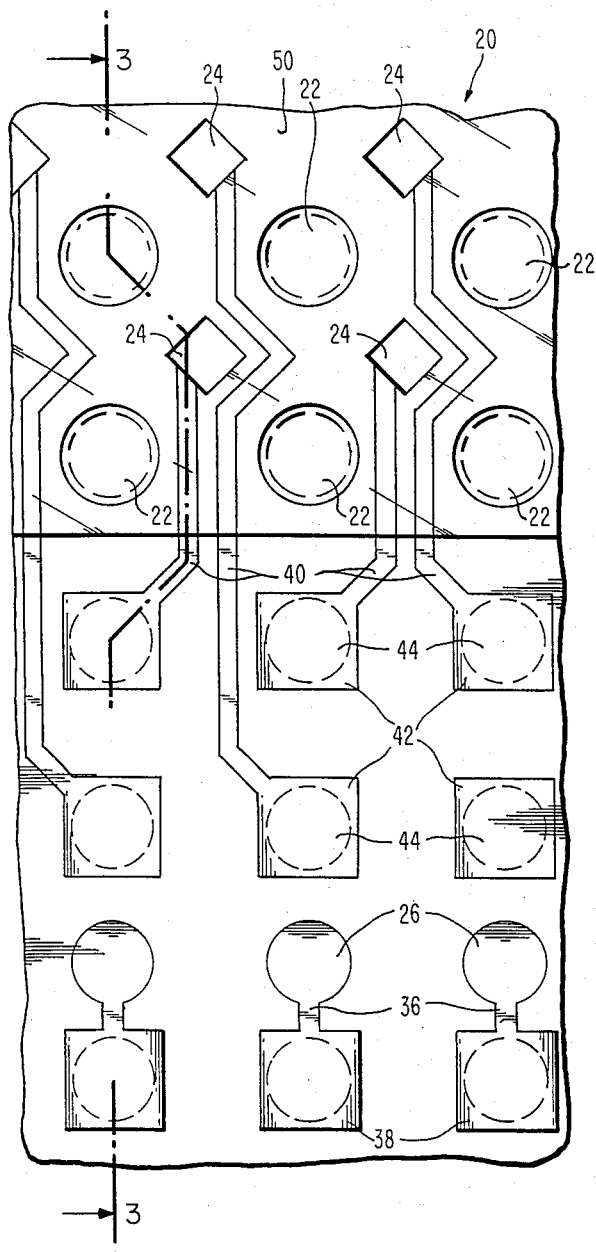
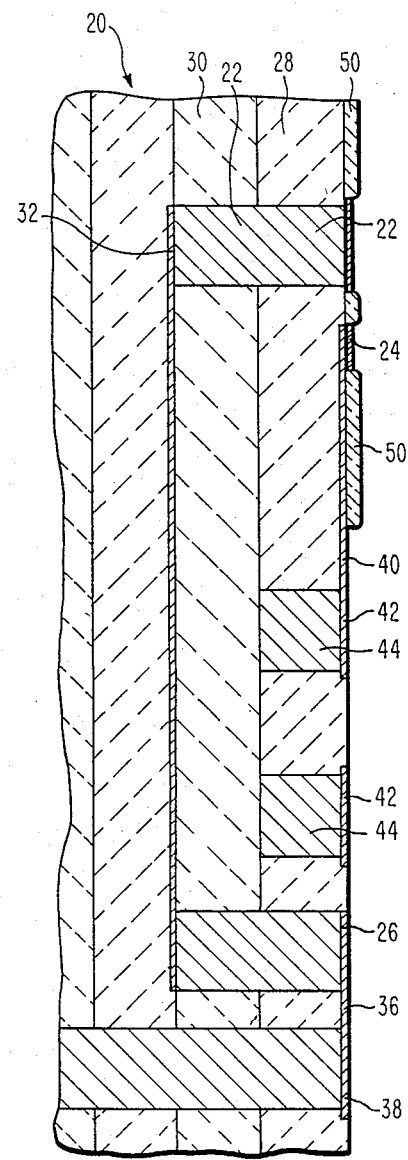
FIG. 2
FIG. 3

PROCESS FOR FORMING A HIGH DENSITY METALLURGY SYSTEM ON A SUBSTRATE AND STRUCTURE THEREOF

TECHNICAL FIELD

This invention relates to forming metallurgy interconnection systems for dielectric substrates for semiconductor packages, and more particularly for the forming of a high density fan out pattern in a multi-layer ceramic substrate.

Future semiconductor packages will be required to mount many highly integrated semiconductor devices, each with hundreds of circuits, on a single substrate, and interconnect these devices into an operative system. This will require that the area of the package substrate be significantly increased, as compared to present single and multiple device package substrates now in common usage, the wiring density increased, and that many closely spaced bonding terminals for connections to the semiconductor devices be provided. A structure that can potentially meet future high density package requirements is a multi-layer ceramic substrate. This structure is described in detail in U.S. Pat. No. 4,245,273. In this substrate the metallurgy is buried within the substrate, making possible a very complex and intricate wiring interconnection. The basic process consists of forming a ceramic slurry of particulate ceramic material, a resin binder, and a solvent for the binder, doctor blading the slurry and drying to produce ceramic green sheets, punching holes in and screening conductive lines on the green sheets, laminating the sheets, and sintering.

Integrated circuit devices are becoming increasingly more dense and larger, thereby necessitating more terminals that are increasingly more densely spaced. In conventional multilayer ceramic substrates, using solder bonding techniques, the top sheet has a punched via configuration matching the terminal configuration of the semiconductor device. The fan out of metallurgy lines is done in the several underlying layers. However, when the via holes are closely spaced, cracks may develop between the vias during sintering due to the differential coefficient of expansion rates of the conductive material in the vias and the ceramic material of the substrate. This presents a yield loss, or if no initial short occurs, it presents a future potential problem. In addition, the large number of closely spaced terminals require increasingly large numbers of underlying layers to provide the metallurgy line fan out function, which adds a significant cost factor to the substrate.

It is known to provide a surface metallurgy fan out pattern, complete with terminals on the top surface of the substrate, as suggested by U.S. Pat. No. 3,968,193. This surface metallurgy system consisting of one or more layers may be provided by screening through a mask or with the use of photolithographic techniques applied after the substrate has been sintered. However, during sintering the substrates may undergo a shrinkage of about 17%. This shrinkage can be accommodated by designing the unsintered substrates larger by the amount of the shrinkage. The shrinkage is not always uniform throughout the area of the substrate. Certain areas may shrink more or less resulting in a distorted pattern of vias on the surface. It may not be possible to align a screening mask or a mask exposing a resist to the pattern vias that must be connected to establish contact with the internal metallurgy of the substrate. The problem is further enhanced as the vias become smaller and the sheet becomes larger.

DISCLOSURE OF INVENTION

An object of this invention is to provide a process for forming a semiconductor package substrate having a conductive surface fan-out pattern interconnected to an internal metallurgy pattern.

Another object is to provide a substrate having an I/O metallurgy pattern comprised of a conductive surface line pattern interconnected in combination with an internal metallurgy system.

Yet another object is to provide a process for forming a closely spaced terminal pattern for connecting to a semiconductor device and a fan out metallurgy pattern on a substrate that does not require increasingly closely spaced vias in the top sheet, and provides a positive and dependable mode of contacting the underlying internal metallurgy with a surface metallurgy pattern.

In accordance with the aforementioned objects, the process of the invention for forming a high density interconnection pattern and metallurgy system for electrically connecting an integrated circuit semiconductor device to a support substrate that embodies, providing an unsintered, green ceramic substrate with an internal metallurgy system including a matrix of vias on the top surface filled with conductive metal paste, forming indented areas in the top surface of the green ceramic sheet that are interspersed between the aforementioned vias, and indented lines that are joined to the indented areas that radiate generally outwardly forming a fan out configuration, filling the indented areas and lines with a conductive metal paste, screening a dielectric layer of ceramic material on the top surface of the substrate that covers the indented lines but leaves the vias and indented areas exposed, and sintering the substrate.

The high density, multiple interconnection pad and fan out metallurgy for a multilayer ceramic module of the invention has a multilayer ceramic substrate with an internal metallurgy system, a plurality of vias arranged in a spaced matrix and an outer ring of vias surrounding the matrix in the top surface of the substrate, a plurality of small indented areas arranged in a matrix arranged within and with alternating vias in the spaces between the matrix of vias, the matrix of areas, and the matrix of indented areas collectively defining an interconnection terminal configuration, a plurality of indented lines in the surface of the substrate, each of the indented lines terminating at one end at an indented area of the matrix, and at the opposite end to one of the vias in the outer ring of vias, conductive metal materials disposed in the indented lines, and in the indented areas forming the surface metallurgy fan out pattern, a dielectric layer of material provided with openings over each of the vias in the matrix of vias, and each of the metal filled indented areas in the matrix of indented areas, and a plurality of terminal pads, each pad located over a via of the matrix of via holes and over an indented area of the matrix of indented areas.

DESCRIPTION OF THE DRAWINGS

FIG. 2 is a top surface view in greatly enlarged scale depicting a portion of a solder pad configuration and surface fan out metallurgy system of the invention.

FIG. 3 is a sectional view taken on line 3—3 of FIG. 2.

DESCRIPTION OF THE PREFERRED EMBODIMENT

Figure 1:
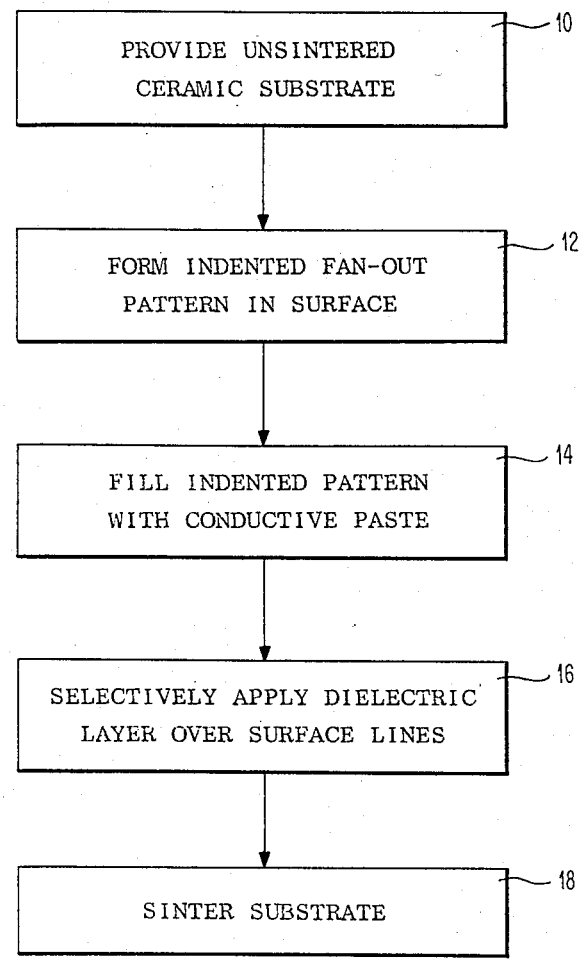
FIG. 1 is a flow chart illustrating the various steps of the method of this invention.

Referring now to the drawings, there is illustrated in FIG. 1 a flow chart that depicts the novel combination of method steps of the invention for the fabrication of a high density metallurgy system in a multi-layer ceramic substrate. Block 10 directs that an unsintered ceramic substrate be provided. The basic structure of the ceramic substrate, preferably a multi-layer ceramic substrate is conventional Block 12 provides additional pads and conductor lines in the surface of the top layer in addition to the normally spaced punched vias. A section of the top surface indicating a preferred specific embodiment is indicated in FIG. 2 in substrate 20. The total terminal pad connection footprint for connecting to a semiconductor device consists of the combination of circular vias 22 arranged in a matrix of rows and columns, and a second matrix of indented areas 24 interspersed between the matrix of vias. As more clearly indicated in FIG. 3, a fan out structure for vias 22 terminate in a series of vias 26 arranged in one or more rows around the border of the pad terminal matrix configuration. As shown in FIG. 3, the via 22 extends downwardly through ceramic layers 28 and 30 where it is joined to a metallurgy stripe 32 that is connected to via 26, again terminating at the surface of the substrate in pad 38. The fan out arrangement in the internal layers of the substrate 20 can extend through more or fewer layers and can extend both in the X and the Y directions normally on different layers. As is well known, the combination of via 26, severable stripe 36 and pad 38 comprise what is commonly known as an engineering change pad. In use, the line portion 36 can be severed and appropriate connections made from pad 38 to other appropriate terminals to correct internal metallurgy system for defects or to make wiring changes. An important aspect of the unsintered substrate 20 is that the density of vias 22 is less dense than the pads of the I/O connections to the device since intermediate connections are made to pads 24. The surface metallurgy structure of the invention consists of surface fan out metallurgy including pads 24, surface lines 40 joined to pads 24 and to pads 42. As indicated in FIG. 3, vias 44 lead downwardly into substrate 20 and are interconnected to the internal metallurgy of the substrate. Engineering changes can also be made to the surface metallurgy pattern by severing the stripe 40 and joining the pads 42 by wires that are bonded to pad 42.

In order to form the surface metallurgy system on substrate 20 a pattern of indented surface areas 24 and indented lines 40 is made in the surface of the substrate. The indentations are possible since the substrate is in its green state and is thus deformable. In addition, the indentations can be aligned to other surface features on the substrate such as vias 42 and proper spacing maintained between vias 22 since the substrate is in its green state and has not yet been deformed by the normal sintering operation. The indented surface features can be formed by making a die containing embossed areas and lines in the desired shape of the indented features in the reverse pattern desired on the substrate. The die can be produced by any conventional metal molding process such as photolithographic techniques to form a pattern over the areas to be raised, followed by a metal removing operation such as metal etching, sputter etching, or electrolytic metal removal techniques. After the die with the embossed lines formed in the reverse image of the pattern, is positioned on the substrate, it is forced inwardly by a suitable pressure and temperature-applying technique such as a lamination press thereby forming indented areas 24, 42 and indented lines 40. The indentations can also be formed by eroding away the surface of the substrate, as by e-beam, laser, or analogous techniques.

The shape, width and depth of the lines can be any dimensions consistent with the associated dimensions of the substrate and sheets. Preferably, the depth of the lines and areas will be in the range of 0.3 to 2 mils. The width of the indented lines will be in the range of 0.5 to 2 mils, more preferably from 1.0 to 2.0 mils. Preferably the ratio of the width of the lines to the depth will be of the order of 2:1 to 1:1.

Block 14 indicates that the next step in the process of the invention is filling the indented pattern, i.e. the indented areas 24 and indented lines 40 with a conductive paste. If the substrate is formed of a material, such as alumina that requires a high sintering temperature, the conductive paste must be of a refractory metal. The paste is well known consisting basically of a particulate refractory metal i.e. Mo, W or Ta, combined with a resin and a solvent for the resin along with plasticizers if desired. If, however the material of the substrate is a glass-ceramic material having a sintering temperature that is not as high as alumina, other suitable metals with higher conductivities, such as copper can be used. In any event, the conductive paste applied to the indented pattern must be capable of withstanding the subsequent sintering operation. The paste can be applied by any suitable technique, as for example, wiping the surface of the substrate with a suitable apparatus which selectively deposits the paste in the indentations. A better technique for applying the paste in the indentations is to first apply a thin plastic film over the surface of the substrate, and subsequently form indentations. The plastic film facilitates the deposition of the conductive material in the indentations. A technique for applying conductive paste into indentations in a substrate is described in greater detail in IBM TDB Apr. 1974 P. 3561. In this process the Mylar sheet, used as a coating base for doctor blading the ceramic slurry, is initially coated with polyvinyl alcohol. On peeling the cast green sheet from the casting base sheet, the polyvinyl alcohol coating strongly adheres to the green ceramic sheet forming a thin smooth uniform surface film. Indentations of the desired patterns are then pressed into the coated green ceramic sheet. The film will allow indentations to be formed. The conductive paste is squeezed into the indentations and the solvent allowed to evaporate. The film is burned off during sintering. Alternately, the surface film can be applied to the green sheet after it has been cast, either as a coating or a precast sheet. Instead of polyvinylalcohol, polyamide may be used.

Block 16 indicates that the next step in the process of the invention involves selectively applying a dielectric layer 50 over the area of the terminal pad configuration. The dielectric layer 50 should not extend over the rows of engineering pads 42, 36 and 38. The dielectric layer is applied over the I/O terminal area in order to prevent solder bridging between the very closely spaced via I/O pads and the lines when the device is solder bonded to the pad configurations. Preferably the device is joined to the pad configurations utilizing solder joining as described in detail in U.S. Pat. Nos. 3,495,113 and 3,429,040. Most preferably the dielectric layer 50 is formed of a material that will withstand the sintering operation. A preferred material is a ceramic slurry similar to the ceramic slurry used to fabricate the green ceramic sheets of the substrate. It is understood that various combinations of solvent and organic thickening (thixotroping) agents may be used for convenience in screening. To avoid weakening the unfired metal lines at the edge of the screened ceramic area, the slurry is preferably constituted so that it does not weep solvent after screening. The ceramic slurry can be applied over the pad area through a suitable screening mask. The mask must provide block out areas to avoid applying the ceramic materials over the via 22 and indented area pads 24. The thickness of the dielectric layer is most preferably in the range of 0.1 to 1.0 mils. After the dielectric layer has been applied over the pad area, the substrate is sintered in the conventional manner as indicated by block 18. During the sintering operation, the substrate will normally undergo a shrinkage of approximately 17% depending on the ceramic, the sintering conditions, etc. Further, the substrates may be somewhat distorted during the sintering operation, but the distortion, if any occurs, will not be so serious as to distort the location of the individual pad areas used to join the substrate to a semiconductor device. The fine alignment steps have all been completed prior to sintering.

Following the sintering operation, the metallurgy areas including vias 22, pads 24, the engineering change pads and vias 42 and the indented patterns not covered by the dielectric layer can be coated with a suitable metal to make the pads solder wettable, and the associated engineering change pads coated with a metal capable of permitting wires to be joined by thermal compression bonding or other techniques. Conventional techniques are utilized to form this metallurgy on the surface of the substrate.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. A process for forming a high density solder pad and fan-out metallurgy system for electrically connecting an integrated circuit semiconductor device to a support substrate comprising,
   providing an unsintered green ceramic substrate with an internal metallurgy system including a matrix of vias on the top surface filled with conductive metal paste,
   forming indented areas in the top surface of said green ceramic substrate that are interspersed between said vias, and indented lines that are joined to the indented areas and radiate generally outwardly forming a fan-out configuration,
   filling the indented areas and lines with a conductive metal paste,
   screening a dielectric layer of ceramic material on the top surface of said substrate that covers said indented lines but leaves said vias and said indented areas exposed, and
   sintering the substrate.

2. The process of claim 1 wherein said substrate is a multi-layer ceramic substrate formed of a plurality of laminated green sheets, where each sheet has vias filled with conductive metal paste, and lines on a surface of conductive paste, wherein the via and line metallurgy on the sheets collectively form said internal metallurgy system.

3. The process of claim 1 wherein said vias on the top surface of the substrate are arranged in a rectangular matrix, and said indented areas are positioned between the vias in a similar but displaced matrix, said vias and indented areas forming a complete interconnection pad pattern for solder joining a semiconductor device.

4. The process of claim 1 wherein the depth of said indented areas and lines is in the range of 0.3 to 2 mils.

5. The process of claim 4 wherein the width of said indented lines is in the range of 0.5 to 2 mils.

6. The process of claim 4 wherein the width of said indented lines is of the order of 3 times the depth of the lines.

7. The process of claim 1 wherein the conductive metal paste applied to the indented areas and indented lines includes a particulate refractory metal selected from the group consisting of Mo, Ta, and W, and mixtures thereof.

8. The process of claim 1 wherein the conductive metal paste applied to the indented areas and indented lines includes a particulate metal that will withstand the high temperature environment necessary to sinter the ceramic material of the substrate.

9. The process of claim 1 wherein said dielectric layer of ceramic material is a slurry that includes a particulate ceramic material, an organic resin, and a solvent for the resin.

10. The process of claim 10 wherein said slurry is similar to the slurry used to form the laminated green sheets of the substrate.

11. The process of claim 1 wherein said dielectric layer of ceramic material has a thickness in the range of 0.1 to 11 mils.

12. The process of claim 2 wherein a thin coating of polymerized organic resin is applied to the green ceramic sheets located on the top of said substrate,
    the indented areas and lines formed in said green ceramic sheet through said thin coating,
    said conductive material applied to said indented areas and lines.

13. The process of claim 12 wherein said conductive paste is applied by wiping a quantity of paste over the indented surface.

14. The process of claim 13 wherein said polymerized organic resin coating is formed of a polymerized polyvinyl alcohol resin.

15. The process of claim 13 wherein said polymerized organic resin coating is applied to the ceramic sheet by
    applying the organic resin coating to a flexible support sheet,
    doctor blading a ceramic slurry on the support sheet and overlying resin coating,
    drying the slurry to form a green ceramic sheet, and
    removing the resultant cast ceramic sheet and the adherent organic resin coating from the support sheet.

* * * * *